United States Patent
Sheets

[19]

[11] Patent Number: 5,530,516
[45] Date of Patent: Jun. 25, 1996

[54] LARGE-AREA PROJECTION EXPOSURE SYSTEM

[75] Inventor: Ronald E. Sheets, Santa Ana, Calif.

[73] Assignee: Tamarack Scientific Co., Inc., Anaheim, Calif.

[21] Appl. No.: 318,149

[22] Filed: Oct. 4, 1994

[51] Int. Cl.⁶ .................................................. G03B 27/42
[52] U.S. Cl. .................................................. 355/53
[58] Field of Search .................................................. 355/53

[56] References Cited

U.S. PATENT DOCUMENTS

| | | | |
|---|---|---|---|
| 3,494,695 | 2/1970 | Sollima et al. | 355/53 |
| 3,819,865 | 6/1974 | Feldman et al. | 355/51 |
| 3,884,573 | 5/1975 | Franklin | 355/51 |
| 4,011,011 | 3/1977 | Hemstreet et al. | 355/18 |
| 4,068,947 | 1/1978 | Buckley et al. | 355/72 |
| 4,391,494 | 7/1983 | Hershel | 350/442 |
| 4,737,823 | 4/1988 | Bouwer et al. | 355/53 |
| 4,748,477 | 5/1988 | Isohata et al. | 355/53 |
| 4,749,867 | 6/1988 | Matsushita et al. | 250/442.1 |
| 4,880,309 | 11/1989 | Wanta | 356/401 |
| 4,881,231 | 11/1989 | Jain | 372/32 |
| 4,924,257 | 5/1990 | Jain | 355/53 |
| 5,266,790 | 11/1993 | Markle et al. | 250/201.2 |
| 5,285,236 | 2/1994 | Jain | 355/53 |
| 5,291,240 | 3/1994 | Jain | 355/53 |
| 5,298,939 | 3/1994 | Swanson et al. | 355/53 |
| 5,446,519 | 8/1995 | Makinouchi | 355/53 |

OTHER PUBLICATIONS

Douglas S. Goodman of IBM, T. J. Watson Research Center, Yorktown Heights, New York; "Scanning Excimer Ablation System"; Optical Society of America Annual Meeting in San Jose, California, Nov. 6, 1991.

*Primary Examiner*—Matthew S. Smith
*Assistant Examiner*—David A. Lane
*Attorney, Agent, or Firm*—Richard L. Gausewitz

[57] ABSTRACT

Scanning microlithography apparatus for effecting exposures of substrates to radiation sources. A mask support and a substrate stage are disposed in spaced-apart positions directly opposite each other, witch a lens system between them and with a radiation source on the outer side of the mask support. The mask support and substrate stage are at a substantial angle to horizontal in order to achieve benefits including reduction in gravitation-induced sagging of the mask. A massive block of granite is provided at the substantial angle to horizontal, and has a flat face that keeps the mask support and substrate stage at desired positions relative to the radiation source and lens system, during scanning.

30 Claims, 4 Drawing Sheets

LARGE-AREA PROJECTION EXPOSURE SYSTEM

BACKGROUND OF THE INVENTION

Previously, photolithography on areas larger than 8"×8" has been performed using one of three general methods:

(1) Contact or Proximity Printing A mask with the desired pattern is positioned right on top of the substrate (or some 5 to 30 microns higher, in the case of proximity exposure), and collimated light is directed through this mask onto the substrate.

(2) One-Dimensional Scanning Projection Exposure A slit-shaped exposure field is scanned across the mask, and the pattern is transferred by scanning the mask and the substrate with this exposure field. The idea is to avoid any stitching procedures; therefore, the exposure field must be at least as long as the shorter dimension of the substrate.

(3) Step-and-Repeat The substrate is exposed in small rectangular portions, one at a time. Care must be taken that in the transition regions between these portions, no glitches in the alignment (stitching errors) or the exposure intensity (butting error) occur. Large areas are exposed by repetitive use of one or several small masks.

One-dimensional scanning and step-and-repeat operations are inherently expensive. Step-and-repeat needs very high precision stages, which travel over the entire substrate area. This results in a need for laser interferometry, which in turn becomes increasingly costly if applied to long two-dimensional travels. The scanning dimension requires very sophisticated optics, which must yield large field images free of distortions. This drives costs for intermediate panel sizes to very high levels and makes exposure of very large panels (e.g. 500×500 mm) virtually impossible.

Proximity printing, on the other hand, is much more cost efficient. However, the depth of field achievable is limited by the collimation angle of the exposure light. Moreover, Fresnel diffraction produces traces of stray light at any edges of the exposed areas. With photosensitive dielectrics requiring high exposure energies and working in the negative mode, such stray light produces thin skins on top of circuit features (lines, holes, etc.), with consequent serious processing problems. Contact printing can reduce such problems, but here the artwork (mask) is subject to substantial degradation during use, as photoresist or particles from the substrates tend to contaminate and/or scratch the mask. For large areas, the survival chances decrease dramatically, and the mask costs increase, while the process yields suffer significantly.

Alternatively, inexpensive masks made from mylar foil are used for printed circuit board exposures. These can be exchanged frequently at low cost, but they lack the dimensional stability for fine line patterning.

In short, a cost-performance gap exists between low cost, low quality contact printing and high performance, high cost exposure equipment. It has been proposed, on paper, to fill this cost-performance gap; however, to the best of applicant's knowledge, this gap has not as yet been filled with something that will actually work satisfactorily and efficiently in the production of quality components.

SUMMARY OF THE INVENTION

The system comprises a rigid structure composed of a heavy granite base and a precision air-bearing stage, the latter being used to simultaneously move the mask and substrate during the scanning operation. The granite has a high-quality ultra-flat surface, which the air-bearing stage rides against. A Dyson lens assembly is provided and is supported by the granite. The granite is supported by a heavy structural steel frame that is mounted on vibration isolators.

The mask support (which supports the large-area glass) and the substrate support—namely a stage assembly—are connected to each other so as to scan together in spaced-apart directly-opposite parallel relationship to each other. The Dyson lens is disposed between them and is stationary, and the radiation source (light source or laser, for example) is disposed on the side of the mask remote from the substrate.

The entire assembly comprising the mask support, stage assembly and associated parts is very heavy, yet is caused to scan smoothly and with relatively little friction, and no substantial oscillations, and with very little gravitation-induced (or other) sagging of the glass mask. These major results are achieved by causing the steel frame to tilt the flat face of the granite at a substantial angle to horizontal, for example at least 60 degrees to horizontal and preferably about 80 degrees to horizontal. Furthermore, a combination air bearing and vacuum bearing is interposed between the stage assembly and the flat face. This provides for substantially frictionless and steady oscillation-free scanning of the stage-mask support combination, and also creates a component of force urging the stage assembly toward the flat granite face. This force combines with a component of gravitational force to achieve the desired resultant force maintaining the stage assembly and associated parts steadily at the precise desired small distance from the flat face.

In additional to the air bearing, there is a recirculating linear ball bearing between the lower portion of the stage-mask support combination, namely the connector means therebetween, and a rigid beam that is disposed horizontally and that moves up the inclined face during scanning. Such movement of the assembly up and down the flat face is achieved by motors at opposite ends of the indicated rigid beam, these being associated with lead screws that are parallel to each other and extend upwardly-downwardly.

DETAILED DESCRIPTION OF THE PREFERRED EMBODIMENT

The present invention provides a method and apparatus for obtaining a large-area projection exposure using a high numerical aperture (high resolution) lens with a relatively small field as compared to the very large size substrate. Substrate sizes may range from 300 mm to 1,000 mm square or higher. A Dyson lens system with image-erecting prism means is provided, which images a 30×30 mm field or 60×60 mm field (or other field) onto the substrate. Reference is made to U.S. patent application Ser. No. 08/302,584, filed Sep. 8, 1994, for a Unit Magnification Projection System and Method, inventors Ronald E. Sheets and Yanrong Yuan. The specification (not claims) and drawings of said application are hereby incorporated by reference herein.

Uses of the apparatus and method including making flat panel displays, multi-chip modules, printed circuit boards, etc. Various radiation sources may be employed, including (for example) ultraviolet and laser.

Figure 1:
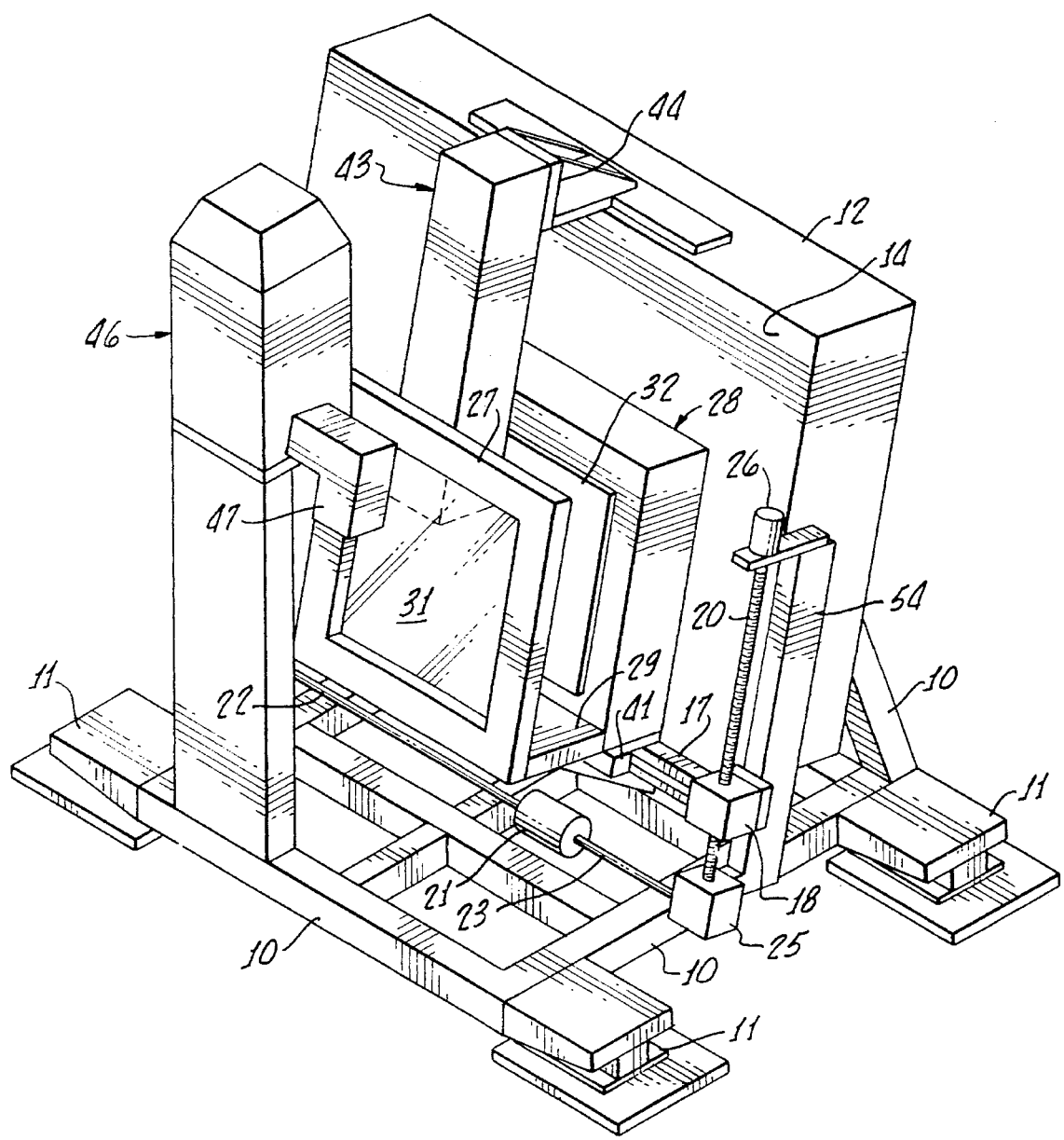
FIG. 1 is an isometric view of a system constructed in accordance with the present invention, the external housing and other external components being unshown.
Figure 3:
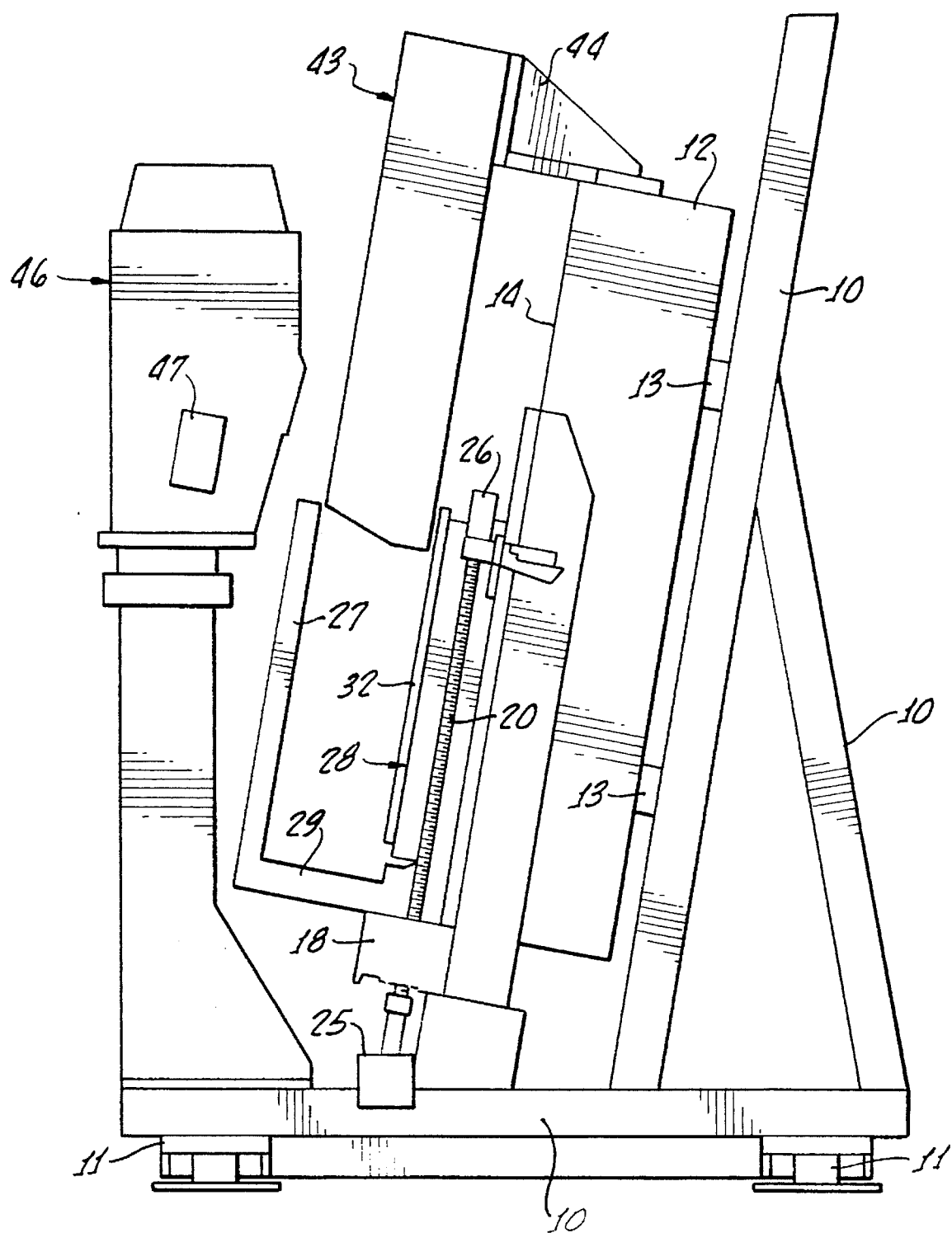
FIG. 3 is a side elevational view of the system.

Referring to the drawings, a large strong welded steel frame 10 is provided as best shown in FIGS. 1 and 3. There is a horizontal frame portion (FIG. 1), an upwardly-extending inclined frame portion (FIG. 3), and a brace portion. The frame 10 is mounted on a suitable support, such as a large thick concrete floor, by four vibration-isolating pad assemblies 11.

Because of the inclination of the below-described granite, the horizontal portion of frame 10 may be much smaller than if the granite were horizontally disposed. A typical size reduction is fifty percent in floor space. Other and vastly greater advantages of the tilting are described below.

The large granite block (base) is indicated at 12, being connected by three attachment means 13 to the inclined portion (FIG. 3) of frame 10. The face 14 of granite block 12 is made extremely flat at its working portion. This is done by lapping and by mapping the surface to assure a high degree of flatness. Stated otherwise, the flat surface is diamond lapped flat to 0.5 to 1.0 microns over the active area where the below-described air bearing rides.

Figure 2:
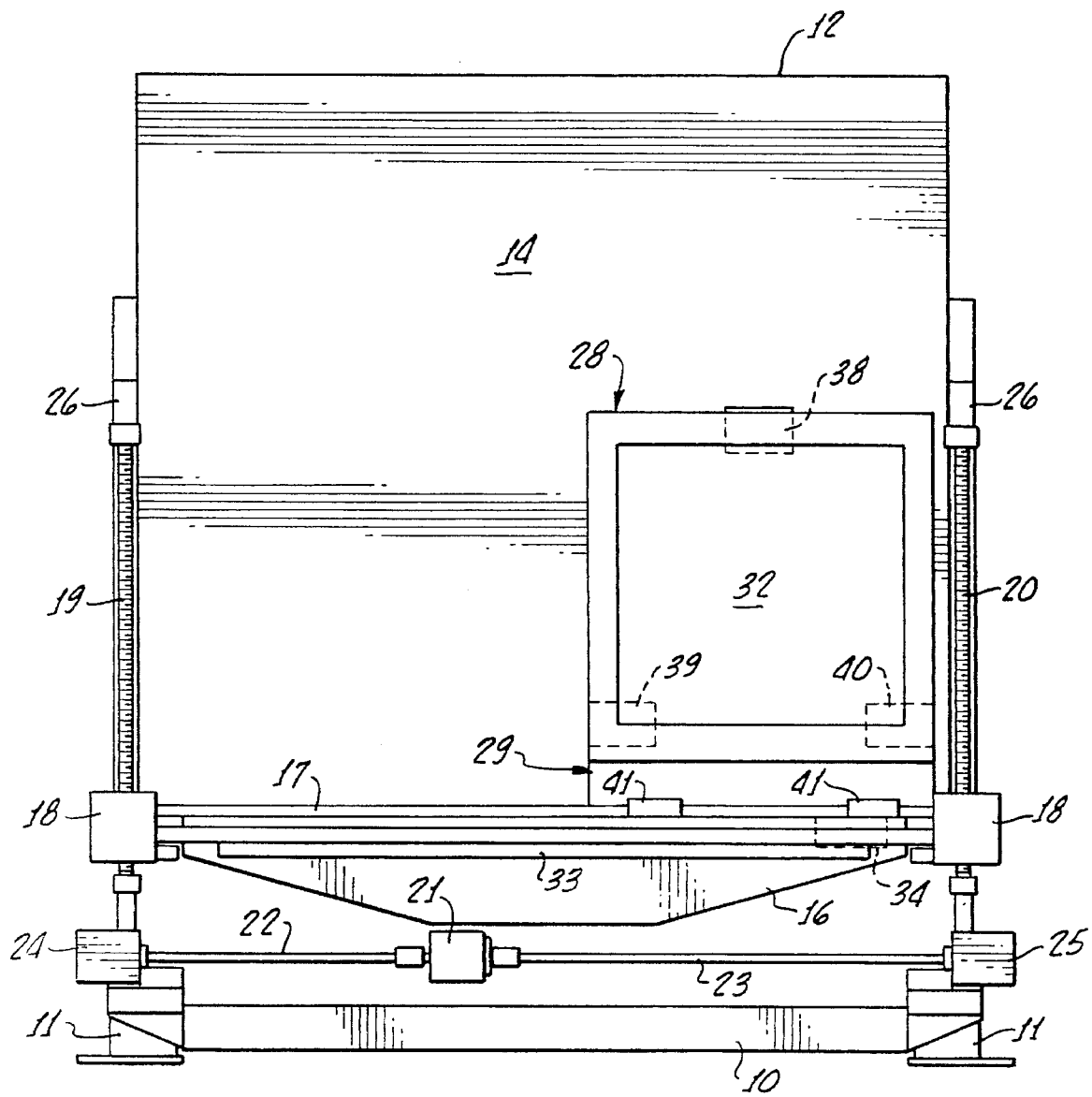
FIG. 2 is a view, looking toward the flat face from the interior of the system, indicating the stage assembly in one position relative to the face.

As shown in FIG. 2, a rigid horizontal beam 16 is mounted across face 14. Beam 16 is rigidly associated with a horizontal bar 17 that extends for the full width of flat face 14. The ends of beam 16 connect to ball bearings 18 which, in turn, are associated with vertical lead screws 19,20.

Lead screws 19,20 are driven in synchronism with each other by a motor 21, which connects to the lead screws through shafts 22,23 and right-angle drives 24,25. Encoders 26 at the upper ends of lead screws 19,20 feed information, regarding lead screw positions, to a computer.

There is mounted on beam 16 and bar 17 a massive assembly comprising a mask support 27, a stage assembly 28, and connector and mounting means 29 that rigidly connect the mask support and stage assembly to each other. Stated otherwise, the connector means 29 connects the stage assembly to the mask support and vice versa.

As described further below, the mask support and stage assembly are in spaced-apart parallel planes and are directly opposite each other. The mask is represented at 31, being a large flat glass plate on which the pattern is provided by vapor deposition and etching, for example. The substrate is represented at 32, being a workpiece having a photoresist thereon. It is to be understood that the substrate may also be of a different type, for example, one ablated as by an excimer laser.

Mask 31 is held in position as by vacuum means associated with mask support 27. The mask is vacuum clamped to the mask support or chuck at the outer 20-25 mm. The chuck holds the mask parallel to the flattened granite face.

Motor 21 is operated intermittently, each time the massive assembly 27–29 is at the end of one of its horizontal scan motions. Each horizontal scan motion is achieved by a linear motor having a linear stator 33 mounted on beam 16 (FIG. 2). Such stator is associated with a movable "rotor" or armature 34 which, in turn, is associated with connector and mounting means 29 to achieve movement of the massive assembly 27–29. The linear motor 33,34 cooperates with motor 21 in effecting a serpentine or raster-type scanning motion. Linear motor 33,34 is a brushless D.C. servo motor, available from Trilogy Company of Houston, Tex.

The bearing means for the massive assembly 27–29 are among the very important elements in the system. Combination air and vacuum bearings 38 are provided between stage assembly 28 and flat face 14. Three such air/vacuum bearings are indicated at 38–40 in FIG. 2, and are connected to suitable sources of air pressure and vacuum, not shown. The air/vacuum bearings are shown as three in number, two at the bottom and one at the top for a three-point support. They "fly" the stage assembly 28 a slight distance "above" flat face 14, in the absence of substantial oscillations, and—furthermore—operate to produce a large resultant force pushing the massive assembly 27–29 toward the flat face. This resultant force is preferably about 100 pounds per bearing, or three hundred pounds total.

Because of the tilting of granite block 12 from the horizontal, it becomes practical and economic to employ a recirculating linear ball bearing below assembly 27–29 instead of air bearings at such region. It is to be understood, however, that air bearings could also be employed at that region, with greater expense and size.

The recirculating linear ball bearing is indicated schematically at 41 in FIGS. 1 and 2, being in the nature of a saddle that is disposed above bar 17 and incorporates rows of balls disposed in grooves that extend longitudinally of the direction of motion, there being return paths by which the balls recirculate continuously back to their points of beginning.

The air/vacuum bearings 38–40, and the recirculating linear ball bearing 41, are commercially available. For example, the air/vacuum bearings are available from Dover Air Bearing Company of Massachusetts, while the recirculating ball bearings are available from NSK Company of Japan.

Figure 4:
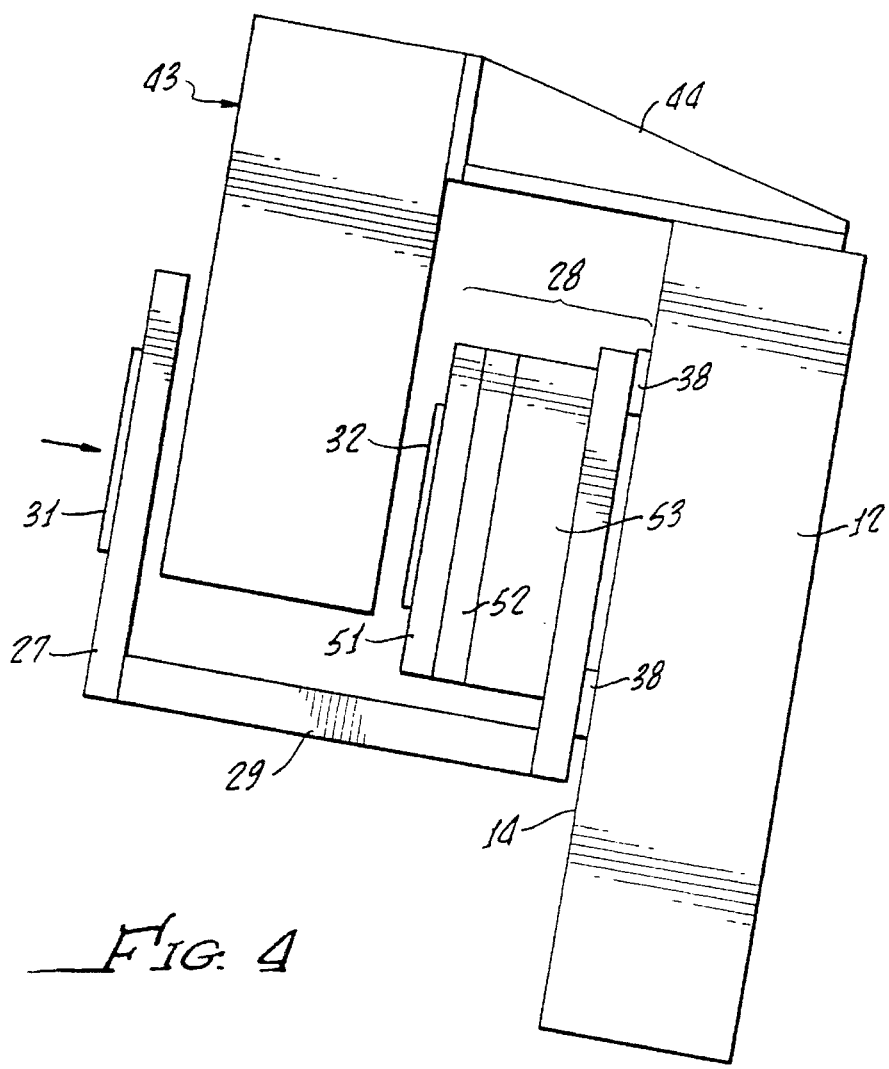
FIG. 4 is a schematic or representational view representing part of FIG. 3 and emphasizing the stage assembly.

It is an important feature of the invention that the mask 31 and substrate 32 are relatively close to each other, besides lying in different planes and being directly opposite each other. Typical spacing distances between mask and substrate being between 200 mm and 350 mm. Such closeness, and other major advantages, are achieved by employing the Dyson lens system 43 that is fixedly disposed between mask and substrate as shown in FIGS. 1, 3 and 4.

To assure rigidity of mounting of the lens system, its housing is supported by granite base 12 by the support means 44 (which connects rigidly to the granite). As previously stated, the preferred Dyson lens system is described in the cited patent application. It comprises a right-angle prism, a roof prism, a plano-convex lens, and a slightly aspherical concave mirror. Radiation (UV light, a laser beam, etc.) is generated in a radiation source 46 that (in the case of a UV source) includes a collimating means and a partial mirror that turns only the UV light through a housing extension 47 and directly through mask 31 to the right-angle prism of the Dyson system. The light then passes through the lens means of the Dyson system to the aspherical concave mirror, then back to a roof prism which cooperates with the mirror in erecting the image prior to passing it to the substrate 32. Because the image has the same orientation at the substrate as at the mask, the described conjoint scanning of mask and substrate relative to radiation source 46,47 and relative to Dyson lens system 43 is possible.

It is pointed out that the lens support 44 mounts the Dyson lens system 43 in cantilevered relationship and in parallel relationship to the mask 31 and substrate 32. The relationship is close but not touching; the schematic or representational view of FIG. 4 is somewhat expanded.

It is emphasized that the combination of the component of gravity force that is directed toward face 14 and the resultant air bearing/vacuum force that is directed toward such face, provides a smooth friction-free oscillation-free travel of the stage assembly 28 during scanning exposure. The linear ball bearing operates, as described above, in cooperation with the air bearing.

Referring now to FIG. 4, substrate 32 is supported by a vacuum chuck 51 which, in turn, is mounted on a substage that allows focusing, planarization and alignment of the substrate relative to the mask. The substage has the ability to move the substrate in x, y, theta, z and tip-and-tilt directions. It utilizes three stepper motors with fine antibacklash lead screws to move the substrate in the x, y and theta directions. The z axis (focusing and planarization) is accomplished by three stepper motor/gear reduction/cam drive mechanisms that move the substrate toward or away from the lens for focusing. Also, to planarize the substrate, each of the last-mentioned three motors can be independently driven in order to level the top of the substrate with respect to the granite face 14.

In FIG. 4, the elements indicated in the previous paragraph are represented by two blocks, one being numbered 52 and being a platen, flexure-mount frame assembly that moves relative to the connector and mount means 29 with leveling. The other block, numbered 53, represents the carriage frame assembly with x, y, theta and z drive motors indicated above. The latter block, number 53, rests on the air bearing/vacuum section of the massive assembly 27–29, which in turn is associated with flat face 14 as above described. It "flys" the assembly relative to flat face 14 at (for example) about two to four microns thereabove.

Referring again to the granite block or base 12, it is very heavy and accordingly has high inertia so as to cooperate with the vibration-isolating pads 11 in isolating the mask and substrate and associated parts from the effects of ambient vibrations. A typical weight of the granite block is a few thousand pounds. The massive assembly comprising elements 27–29 weighs several hundred pounds. The assembly 27–29 is associated only with the granite block, and also is substantially free of vibrational forces from the outside. As shown in FIG. 1, the lead screw 20 and associated parts are mounted on granite block 12 as by the indicated strong bracket or support means 54. There is a mirror image bracket for lead screw 19.

As above emphasized, the block or base 12 is so tilted that its face 14 is at a substantial angle to horizontal. The angle is at least about 60 degrees to horizontal, and is preferably in the range of about 75 degrees to about 85 degrees to horizontal. The preferred angle to the horizontal is about 80 degrees. This maximizes the below-described beneficial effects of the tilting relative to mask 31, and relative to minimization of floor space requirement, and relative to utilization of the ball bearing means, while still preserving a component of gravity urging the mask and substrate assemblies toward face 14 and cooperating with the air/vacuum bearings in this result.

Because of the described angle from horizontal, the glass plate forming the mask 31 does not sag, in response to, gravity, to a damaging extent. It has been calculated by applicant that a BK7 glass having fixed edges will, if in a horizontal plane, sag 120 microns if one millimeter thick. If about 2.5 millimeters thick, it will sag about 20 microns when horizontal. On the other hand, the same glass tilted at 80 degrees from the horizontal will, if one millimeter thick, sag only about 21 microns and if about 2.5 millimeters thick, will sag only about 4 microns. At a glass thickness of about 4 millimeters, the sag is about 1.31 microns at 80 degrees; it is only 0.21 microns at 10 millimeters of glass thickness.

The stated sag values relate to a glass size of 410 mm by 515 mm, and an opening size of 370 mm by 475 mm. The sag is the maximum deflection at the center of the glass. The small amount of sagging of the glass, in accordance with the present invention, coupled with the simultaneous spaced-apart directly-opposite scanning of substrate and mask, produce excellent results relative to substantial absence of distortion, etc.

Figure 5:
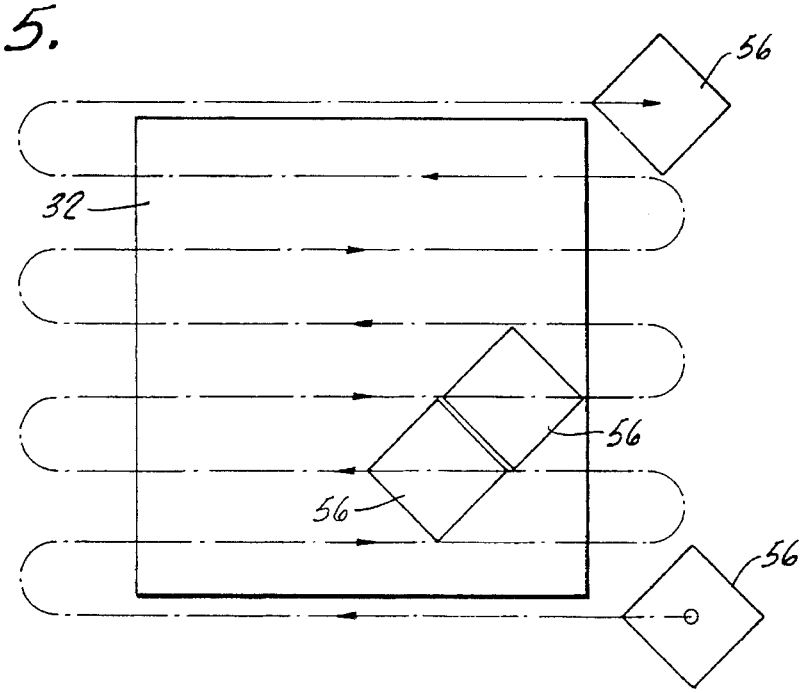
FIG. 5 is a schematic representation of the scanning motion.

Referring next to FIG. 5, the radiation field is shown as being what is called in a "diamond" numbered 56. Actually, it is a square that is rotated so that a diagonal is vertical in FIG. 5. Other shapes could be employed. The nominal length of each side of the square is, in the present system, 30 mm or 60 mm. Other sizes and shapes could be employed.

Exposure of the photoresist-coated plate (substrate 32) is accomplished by scanning the co-mounted mask and substrate over the respective field size. Scanning is (as above indicated) done in a serpentine or raster manner with the diamond-shaped image area. This diamond-shaped pattern provides a uniform exposure dose over the entire substrate. The described linear motor drives the air-bearing (etc.) stage with controlled velocities along the x axis; stepping from row to row is effected by motor 21 and associated parts in the y axis. To achieve the correct exposure dosage, the system measures the beam intensity (radiation intensity) before the scan starts, and calculates the required scan velocity to achieve the dosage set into the process recipe.

For convenience, the following description is written as though the light source—not substrate and mask—were scanned.

Starting (for example) at the lower-right hand corner, FIG. 5, diamond 56 is brought up to full scanning speed before it is in line with substrate 32, following which it scans across the lower edge of the substrate and then decelerates at the lower-left in FIG. 5. Vertical stepping is then effected by motor 21 and associated components, following which the diamond is brought up to speed prior to being in line with the substrate, as described. There is a serpentine scanning motion with half-overlap, the half-overlap being shown relative to the diamonds that are illustrated as being directly over the right-lower quadrant of substrate 32. The scanning action continues until the upper-right corner is reached. It is to be understood that, of course, there is only one diamond at any position at any time, the four diamonds illustrated being to show different positions of that one diamond.

Substrate-to-mask alignment is accomplished with a through-the-lens pattern recognition system with dual magnification optics, CCD camera and pattern-recognition electronics. A "Cognex" (Cognex Corp. of Massachusetts) pattern recognition system is utilized to compare fiducial images on the mask and the substrate, and provide position-correction data to the plate x-y-theta stage drive motors, thereby bringing the plate into alignment with the mask. This capability allows the fiducials to be located any place on the mask and the plate. Least-squares algorithms in the computer associated with the present system provide alignment accuracy (overlay) of under 2 microns. The system allows the required accuracy to be set into the recipe, and the system will align to these tolerances, or will alert the operator if it cannot be achieved.

The Dyson lens system has advantages additional to those stated above, for example the ability to have the numeral aperture changed so as to change the depth of focus. This is significant especially relative to rough substrates.

The foregoing detailed description is to be clearly understood as given by way of illustration and example only, the spirit and scope of this invention being limited solely by the appended claims.

What is claimed is:

1. Apparatus for effecting exposures of substrates to radiation sources, which comprises:
   (a) a support for a mask,
   (b) a stage for a substrate,
   (c) means to dispose said mask support and said substrate stage in such predetermined spaced-apart positions relative to each other that said mask and substrate are in different planes that are parallel to each other and are spaced apart from each other,
   said mask support and substrate stage positions also being such that said mask and substrate are opposite each other,
   (d) a lens system disposed, at least in part, between said mask support and said substrate stage,
   (e) a radiation source,
   said mask support, substrate stage, lens system and radiation source being so disposed that radiation from said source passes through said mask, then through said lens system, and then to said substrate stage, and
   (f) means to effect simultaneous same-direction uniform correlated scanning, relative to each other, of said mask support and substrate stage on the one hand, and said radiation source and lens system on the other hand,
   characterized in that said mask support and substrate stage are not horizontal but instead are at a substantial angle to horizontal, whereby to achieve advantages including substantial reduction in gravitation-induced sagging of said mask.

2. The apparatus as claimed in claim 1, in which said substantial angle is at least about 60 degrees.

3. The apparatus as claimed in claim 1, in which said means to dispose said mask support and substrate stage in predetermined positions such that said mask and substrate are parallel to each other and opposite each other includes means to connect said mask support and substrate stage to each other, and in which said means to effect scanning comprises motor means to scan said mask support and substrate stage relative to said radiation source and lens system, said radiation source and lens system being stationary.

4. The apparatus as claimed in claim 3, in which said substantial angle is in the range of about 75 degrees to about 85 degrees.

5. The apparatus as claimed in claim 3, in which air bearing means are provided to maintain said substrate stage and mask support substantially frictionlessly at said substantial angle during said scanning.

6. The apparatus as claimed in claim 3, in which recirculating ball bearing means are provided to effect support of the portions of said substrate stage and said mask support.

7. The apparatus as claimed in claim 3, in which air bearing means are provided to maintain said substrate stage and said mask support substantially frictionlessly at said substantial angle during said scanning, and in which recirculating ball bearing means are provided to effect support of portions of said substrate stage and said mask support.

8. The apparatus as claimed in claim 1, in which said leans system is a Dyson lens system.

9. The apparatus as claimed in claim 1, in which said mask support includes a large flat glass sheet that has provided thereon pattern means employed in microlithography and the like.

10. Apparatus for effecting exposures of substrates to radiation sources, which comprises:
    (a) a massive block or base of granite having a flat face,
    (b) a support and connector assembly,
    (c) a mask support connected to said support and connector assembly,
    (d) a substrate stage connected to said support and connector assembly,
    (e) a radiation source,
    (f) an image-erecting lens system,
    (g) means to mount said radiation source and said lens system fixedly relative to said block of granite,
    said mask support, said substrate stage, said radiation source and said lens system being so located that radiation from said source support passes through the mask on said mask support and then passes through said lens system and strikes the substrate on said substrate stage,
    (h) means, including a brushless linear motor, to scan conjointly said mask support, and said substrate stage, and said support and connector assembly relative to said radiation source and said lens system,
    (i) air bearing means to relate said mask support, and said substrate stage, and said support and connector assembly to said flat face whereby to keep said mask support and substrate stage steadily at the desired positions relative to said radiation source and lens system, during scanning, and
    (j) means to maintain said block of granite in a tilted condition such that said flat face is at a substantial angle to horizontal.

11. The apparatus as claimed in claim 10, in which ball bearing means are associated with said support and connector assembly to cooperate with said air bearing means in steadily and relatively frictionlessly supporting said mask support and said substrate stage and said support and connector assembly during scanning.

12. The apparatus as claimed in claim 10, in which said air bearing means is a combination air pressure and vacuum means, to provide a net force biasing said substrate stage toward said flat face.

13. The apparatus as claimed in claim 10, in which said tilt means is such that said substantial angle is about 80 degrees.

14. The apparatus as claimed in claim 10, in which said lens system is a Dyson lens system.

15. The apparatus as claimed in claim 10, in which said mask support includes a large flat glass sheet that has provided thereon pattern means employed in microlithography and the like.

16. Apparatus for effecting exposures of substrates to radiation sources, comprising:
    (a) a block or base of granite having a large flat face,
    (b) a rigid support extending across said face,
    (c) first motor means to drive said rigid support along said face,
    (d) a stage assembly disposed parallel to and adjacent said face,
    said stage assembly being adapted to support a substrate in parallel relationship to said face, (e) a mask support disposed parallel to and spaced from said stage assembly, and opposite said stage assembly, and adapted to support a mask, (f) connector means connecting said stage assembly and said mask support, said connector means being adjacent said rigid support, (g) second motor means to move said connector means, and thus said stage assembly and said mask support, along said rigid support, said first and second motor means cooperating with each other to effect conjoint scanning of said stage assembly and mask support relative to said block of granite, (h) lens means fixedly associated with said block of granite and disposed between said stage assembly and said mask support whereby said scanning also effects scanning of said stage assembly and mask support relative to lens means, (i) a radiation source fixedly mounted on the opposite side of said mask support from said stage assembly, whereby said scanning also effects scanning of said stage assembly and mask support relative to said radiation source, and (j) means provided to maintain said block of granite in a position such that said flat face thereof is at a substantial angle to horizontal.

17. The apparatus as claimed in claim 16, in which said substantial angle is at least about 60 degrees.

18. The apparatus as claimed in claim 16, in which said substantial angle is about 80 degrees.

19. The apparatus as claimed in claim 16, in which said means to maintain said block of granite at a substantial angel is a rigid frame.

20. The apparatus as claimed in claim 19, in which vibration-isolator means are provided to support said frame.

21. The apparatus as claimed in claim 16, in which air bearing means are provided to maintain said stage assembly substantially frictionlessly at a predetermined small elevation relative to said face.

22. The apparatus as claimed in claim 16, in which air bearing means are provided to maintain said stage assembly substantially frictionlessly at a predetermined small elevation relative to said face, said air bearing means comprising vacuum means to achieve a net force pressing said stage assembly toward said face, said net force cooperating with gravity to press said stage assembly toward said face.

23. The apparatus as claimed in claim 16, in which air bearing means are provided to maintain said stage assembly substantially frictionlessly at a predetermined small elevation relative to said face, and in which recirculating ball bearing means are provided between said rigid support and said connector means to cooperate with said air bearing means in achieving low-friction scanning.

24. The apparatus as claimed in claim 16, in which means are provided to maintain said face at a steep angle to horizontal, in which said connector means is below both said mask support and said stage assembly, in which air bearing means are provided between said stage assembly and said face, and in which recirculating ball bearing means are provided between said rigid support and said connector means.

25. The apparatus as claimed in claim 24, in which said rigid support is substantially horizontal.

26. The apparatus as claimed in claim 16, in which said first motor means comprises two motors connected to drive two elongate parallel screws, said screws being rotatably associated with spaced apart portions of said rigid support.

27. The apparatus as claimed in claim 16, in which said second motor means comprises an elongate linear electric motor.

28. The apparatus as claimed in claim 16, in which said first motor means comprises two motors connected to drive two elongate parallel screws, said screws being rotatably associated with spaced apart portions of said rigid support, and in which said second motor means comprises an elongate linear electric motor.

29. The apparatus as claimed in claim 16, in which said lens system is a Dyson lens system.

30. A method of producing electronics components, comprising:

(a) providing the following apparatus:

a support for a mask, a stage for a substrate, means to dispose said mask support and said substrate stage in such predetermined spaced-apart positions relative to each other that said mask and substrate are in different planes that are parallel to each other and are spaced apart from each other, said mask support and substrate stage positions also being such that said mask and substrate are opposite each other, a lens system disposed, at least in part, between said mask support and said substrate stage, a radiation source, said mask support, substrate stage, lens system and radiation source being so disposed that radiation from said source passes through said mask, then through said lens system, and then to said substrate stage, and means to effect simultaneous same-direction uniform correlated scanning, relative to each other, of said mask support and substrate stage on the one hand, and said radiation source and lens system on the other hand, said mask support and substrate stage not being horizontal are instead being at a substantial angle to horizontal, whereby to achieve advantages including substantial reduction in gravitation-induced sagging of said mask, and (b) employing said apparatus to effect commercial production of products selected from a class consisting of multichip modules, printed circuit boards, and flat panel displays.

\* \* \* \* \*